United States Patent
Kyoto et al.

(10) Patent No.: US 11,699,890 B2
(45) Date of Patent: Jul. 11, 2023

(54) SEMICONDUCTOR LASER MACHINE

(71) Applicant: Mitsubishi Electric Corporation, Tokyo (JP)

(72) Inventors: Tomohiro Kyoto, Tokyo (JP); Daisuke Morita, Tokyo (JP); Kimio Shigihara, Tokyo (JP); Keisuke Furuta, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 18/010,468

(22) PCT Filed: Aug. 12, 2020

(86) PCT No.: PCT/JP2020/030686
§ 371 (c)(1),
(2) Date: Dec. 15, 2022

(87) PCT Pub. No.: WO2022/034653
PCT Pub. Date: Feb. 17, 2022

(65) Prior Publication Data
US 2023/0163559 A1    May 25, 2023

(51) Int. Cl.
*H01S 5/023*    (2021.01)
*H01S 5/0237*    (2021.01)
*H01S 5/024*    (2006.01)

(52) U.S. Cl.
CPC ............ *H01S 5/023* (2021.01); *H01S 5/0237* (2021.01); *H01S 5/02469* (2013.01)

(58) Field of Classification Search
CPC ..... H01S 5/023; H01S 5/0237; H01S 5/02469
See application file for complete search history.

(56) References Cited

U.S. PATENT DOCUMENTS

2006/0171434 A1    8/2006    Mochida et al.
2013/0250987 A1*   9/2013    Fujimoto ............ H01S 5/02469
                                                                          372/36
(Continued)

FOREIGN PATENT DOCUMENTS

JP    5-183239 A    7/1993
JP    6-37403 A    2/1994
(Continued)

OTHER PUBLICATIONS

International Search Report and Written Opinion dated Oct. 27, 2020, received for PCT Application PCT/JP2020/030686, filed on Aug. 12, 2020, 9 pages including English Translation.

(Continued)

*Primary Examiner* — Yuanda Zhang
(74) *Attorney, Agent, or Firm* — Xsensus LLP

(57) ABSTRACT

A semiconductor laser machine includes a semiconductor laser element including a first end face that emits a laser beam and a second end face that is opposite the first end face; a heat sink; and a sub-mount securing the semiconductor laser element to the heat sink. The sub-mount includes a substrate that serves as a thermal stress reliever, a solder layer joined to the semiconductor laser element, and a junction layer formed between the substrate and the solder layer. Compared with the semiconductor laser element, the substrate is extended in a rearward direction that is from the first end face toward the second end face. As for the solder layer and the junction layer, a portion of at least the solder layer is removed behind the second end face.

4 Claims, 9 Drawing Sheets

(56) References Cited

U.S. PATENT DOCUMENTS

| | | |
|---|---|---|
| 2013/0299843 A1 | 11/2013 | Motoda |
| 2015/0263487 A1 | 9/2015 | Yamamoto et al. |
| 2016/0099543 A1* | 4/2016 | Kuramoto ............. H01S 5/0234 |
| | | 372/36 |
| 2018/0026421 A1 | 1/2018 | Seidenfaden et al. |
| 2019/0044303 A1 | 2/2019 | Morita et al. |

FOREIGN PATENT DOCUMENTS

| | | |
|---|---|---|
| JP | 2000-183439 A | 6/2000 |
| JP | 2008-85272 A | 4/2008 |
| JP | 2013-143452 A | 7/2013 |
| JP | 2013-236010 A | 11/2013 |
| JP | 2015-173218 A | 10/2015 |
| JP | 2018-14500 A | 1/2018 |
| JP | 2019-102716 A | 6/2019 |
| WO | 2017/141894 A1 | 8/2017 |

OTHER PUBLICATIONS

Notice of Reasons for Refusal dated Mar. 2, 2021, received for JP Application 2020-570203, 8 pages including English Translation.
Decision to Grant dated Jun. 1, 2021, received for JP Application 2020-570203, 5 pages including English Translation.

* cited by examiner

SEMICONDUCTOR LASER MACHINE

CROSS-REFERENCE TO RELATED APPLICATION

The present application is based on PCT filing PCT/JP2020/030686, filed Aug. 12, 2020, the entire contents of which are incorporated herein by reference.

FIELD

The present disclosure relates to a semiconductor laser machine including a semiconductor laser element.

BACKGROUND

A semiconductor laser machine such as a fiber laser or a direct diode laser (DDL) includes a semiconductor laser element that serves as a light-emitting source. Increasing output power of the semiconductor laser machine is promoted mainly in machining areas such as laser cutting and laser welding.

In order to output higher power, the semiconductor laser machine is provided with a heat sink that cools the semiconductor laser element. The semiconductor laser machine with the heat sink may be provided with a sub-mount to relieve thermal stress in the semiconductor laser element. The thermal stress results from a difference between respective thermal expansion coefficients of the semiconductor laser element and the heat sink. The sub-mount is joined to the semiconductor laser element and the heat sink by soldering.

When the sub-mount is soldered to the semiconductor laser element, a molten solder material is pressed against the semiconductor laser element and may climb a face of the semiconductor laser element. The solder material that has climbed the face of the semiconductor laser element can cause a short circuit between an active layer of the semiconductor laser element and a solder layer. Therefore, preventing the solder material from climbing the face of the semiconductor laser element is desirable for the semiconductor laser machine.

A semiconductor laser machine disclosed in Patent Literature 1 includes a semiconductor laser element having two end faces for emitting a laser beam and a sub-mount joined to the semiconductor laser element. In the semiconductor laser machine disclosed in Patent Literature 1, in a direction along the resonator length, a length of the sub-mount is shorter than a resonator length that is a distance between the end faces End faces of the sub-mount are set back toward a middle of the resonator length of the semiconductor laser element respectively from the end faces of the semiconductor laser element. Therefore, this configuration enables a solder material on a face of the sub-mount to be prevented from climbing the end faces of the semiconductor laser element.

CITATION LIST

Patent Literature

Patent Literature 1: Japanese Patent Application Laid-open No. H05-183239

SUMMARY

Technical Problem

According to the conventional technique described in Patent Literature 1, the length of the sub-mount is shorter in the direction along the resonator length as much as the end faces of the sub-mount are set back respectively from the end faces of the semiconductor laser element. Thus the sub-mount has a reduced overall volume. Due to the reduced overall volume of the sub-mount, less heat that propagates from the semiconductor laser element to the heat sink diffuses in the sub-mount. In this case, the semiconductor laser machine has deteriorated efficiency of heat propagation from the semiconductor laser element to the heat sink, meaning that efficient heat dissipation of the heat sink is difficult. Therefore, providing a semiconductor laser machine that can prevent short circuit failure and can efficiently dissipate heat is a difficult problem for the conventional technique.

The present disclosure has been made in view of the above, and an object of the present disclosure is to obtain a semiconductor laser machine that can prevent short circuit failure and dissipate heat efficiently.

Solution to Problem

In order to solve the above-stated problem and achieve the object, a semiconductor laser machine according to the present disclosure includes: a semiconductor laser element including a first end face that emits a laser beam and a second end face that is opposite the first end face; a heat sink; and a sub-mount that fixes the semiconductor laser element to the heat sink. The sub-mount includes: a substrate that serves as a thermal stress reliever; a solder layer joined to the semiconductor laser element; and a junction layer formed between the substrate and the solder layer. Compared with the semiconductor laser element, the substrate is extended in a rearward direction that is from the first end face toward the second end face. In a portion behind the second end face, at least the solder layer is removed out of the solder layer and the junction layer.

Advantageous Effects of Invention

The semiconductor laser machine according to the present disclosure can prevent short circuit failure and dissipate heat efficiently.

DESCRIPTION OF EMBODIMENTS

With reference to the drawings, a detailed description is hereinafter provided of semiconductor laser machines according to embodiments.

First Embodiment

Figure 1:
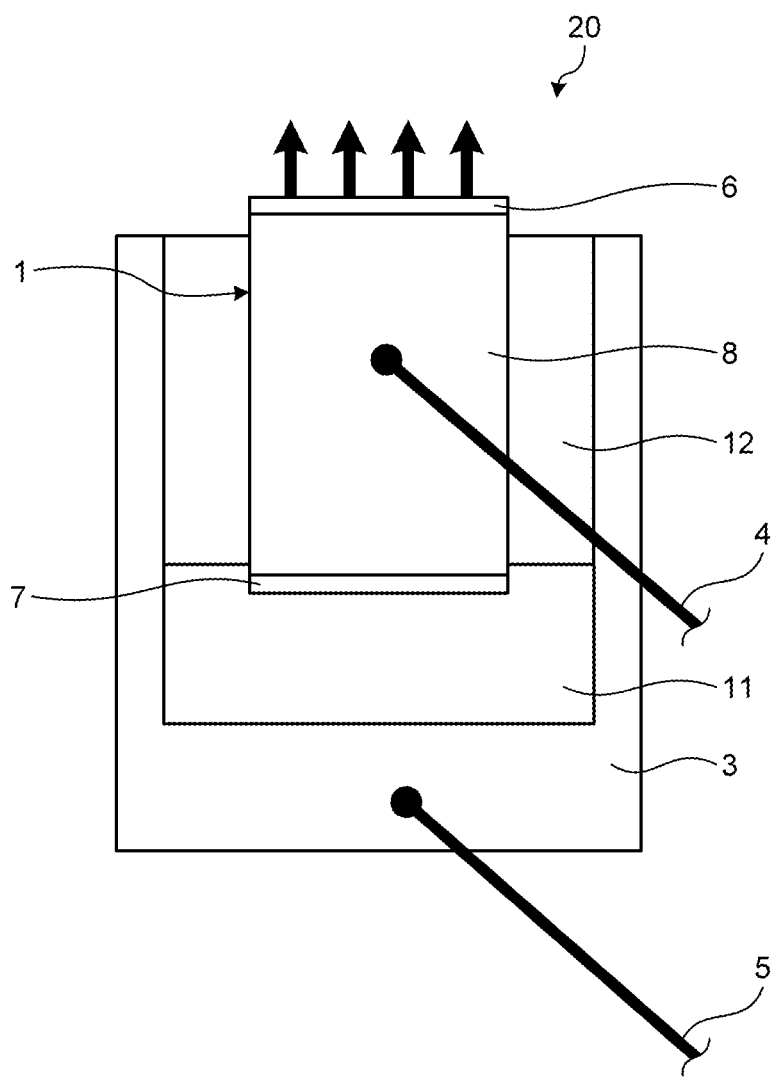
FIG. 1 is a top view of a semiconductor laser machine according to a first embodiment.
Figure 2:
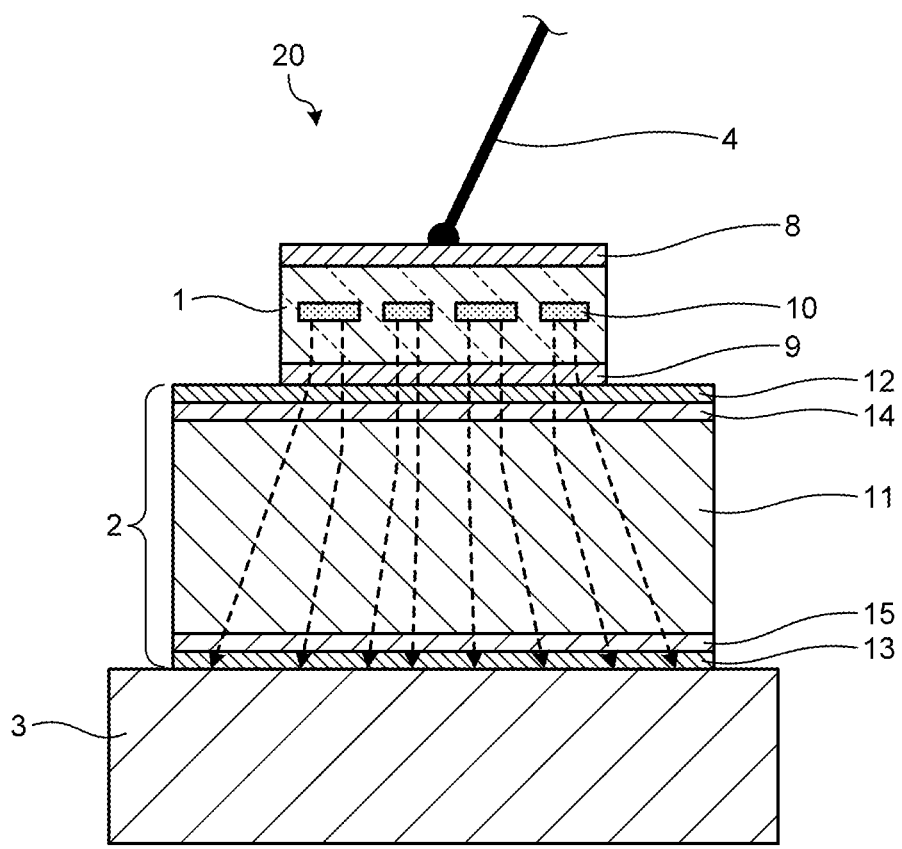
FIG. 2 illustrates a first sectional view of the semiconductor laser machine according to the first embodiment.
Figure 3:
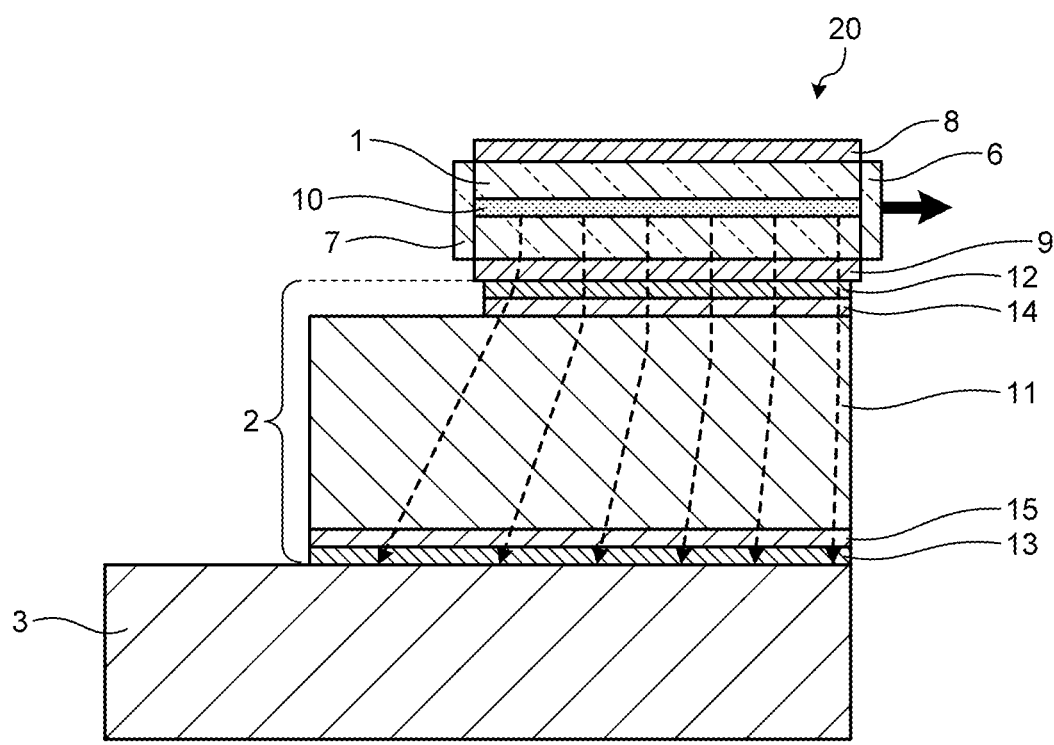
FIG. 3 illustrates a second sectional view of the semiconductor laser machine according to the first embodiment.

FIG. 1 is a top view of a semiconductor laser machine according to a first embodiment. FIG. 2 illustrates a first sectional view of the semiconductor laser machine according to the first embodiment. FIG. 3 illustrates a second sectional view of the semiconductor laser machine according to the first embodiment.

The semiconductor laser machine 20 according to the first embodiment includes: a semiconductor laser element 1; a heat sink 3 that cools the semiconductor laser element 1; and a sub-mount 2 that fixes the semiconductor laser element 1 to the heat sink 3.

The semiconductor laser element 1 is a flat plate-shaped laser diode bar including a plurality of emitters. For the semiconductor laser element 1, a gallium arsenide (GaAs) substrate is used as a semi-insulating substrate. The semiconductor laser element 1 includes an active layer 10 serving as a light-emitting layer. FIG. 1 illustrates an upper face of the semiconductor laser element 1. The semiconductor laser element 1 is joined to the sub-mount 2 at its lower face that is opposite the upper face. The semiconductor laser element 1 includes: a plate-shaped electrode 8 on the upper face of the semiconductor laser element 1; and a plate-shaped electrode 9 at the lower face of the semiconductor laser element 1.

The semiconductor laser element 1 includes a coating film 6 at one of its plural side faces that emits a laser beam, that is to say, a first end face. The semiconductor laser element 1 includes a coating film 7 at another of its side faces that is opposite the first end face, that is to say, a second end face. The first end face and the second end face constitute a resonator. The coating film 6 reflects a portion of incident light and transmits another portion of the incident light. The coating film 7 reflects incident light.

In the semiconductor laser element 1, light generated from the active layer 10 undergoes repeated reflections within the resonator, thus being amplified. The light amplified within the resonator is partly transmitted by the coating film 6, thus being emitted as the laser beam from the first end face of the semiconductor laser element 1.

The sectional view illustrated in FIG. 2 is perpendicular to an optical axis of the resonator. The sectional view illustrated in FIG. 3 includes the optical axis of the resonator and is perpendicular to the sectional view illustrated in FIG. 2. In a description below, directions in which the optical axis of the resonator extends are referred to as optical axis directions. A direction perpendicular to the optical axis directions and in which the semiconductor laser element 1 and the sub-mount 2 are stacked on the heat sink 3 is referred to as a stacked direction. The sectional views illustrated in FIGS. 2 and 3 are both taken along the stacked direction.

The sub-mount 2 includes: a substrate 11 that serves as a thermal stress reliever; a solder layer 12 and a junction layer 14 formed between the semiconductor laser element 1 and the substrate 11; and a solder layer 13 and a junction layer 15 formed between the heat sink 3 and the substrate 11. The solder layer 12 is a first solder layer joined to the semiconductor laser element 1. The junction layer 14 is a first junction layer formed between the substrate 11 and the solder layer 12. The solder layer 13 is a second solder layer joined to the heat sink 3. The junction layer 15 is a second junction layer formed between the substrate 11 and the solder layer 13.

In the first embodiment, the sub-mount 2 is electrically conductive. An electrically conductive material is used for the substrate 11 of the electrically conductive sub-mount 2. A lead wire 4 is connected to the electrode 8. A lead wire 5 is connected to the heat sink 3. The lead wires 4 and 5 are connected to a power supply. The power supply is not illustrated. A voltage is applied between the lead wires 4 and 5, thus the semiconductor laser element 1 is powered.

A material that is used for the substrate 11 has a thermal expansion coefficient between a thermal expansion coefficient of the semiconductor laser element 1 and a thermal expansion coefficient of the heat sink 3. A material having the same thermal expansion coefficient as the semiconductor laser element 1 may be used for the substrate 11. Therefore, the substrate 11 relieves the thermal stress in the semiconductor laser element 1. The material that is used for the substrate 11 also has excellent thermal conductivity to efficiently conduct heat from the semiconductor laser element 1 to the heat sink 3. The material that is used for the substrate 11 of the electrically conductive sub-mount 2 is, for example, copper-tungsten.

The junction layers 14 and 15 are made with a metallic material having excellent electrical conductivity. The metallic material that is used for the junction layers 14 and 15 is, for example, gold, copper, or a composite of gold and tin. Due to the junction layers 14 and 15 in the semiconductor laser machine 20, uniform power supply to the semiconductor laser element 1 becomes possible.

In a process of manufacturing the semiconductor laser machine 20, the semiconductor laser element 1 is disposed, via a molten solder material, on the junction layer 14, which has been formed on the substrate 11. The semiconductor laser element 1 is joined to the sub-mount 2 as the solder material cools and solidifies. The junction layer 15, which has been formed on the substrate 11, is disposed, via a molten solder material, on the heat sink 3. The sub-mount 2 is joined to the heat sink 3 as the solder material cools and solidifies. The solder layers 12 and 13 result from the solidification of the molten solder materials.

A sheet of solder material may be used for joining the semiconductor laser element 1 to the sub-mount 2. In that case, the semiconductor laser element 1 is disposed, via the unmelted sheet of solder material, on the junction layer 14, which has been formed on the substrate 11. The sheet of solder material is melted by heating and then solidified, thus the semiconductor laser element 1 is joined to the sub-mount 2. A sheet of solder material may be used for joining the sub-mount 2 to the heat sink 3 just as the sheet of solder material may be used for joining the semiconductor laser element 1 to the sub-mount 2.

For the heat sink 3, a material with higher thermal conductivity is used and is, for example, a metallic material such as copper or silver. The heat sink 3 may be a so-called water-cooled heat sink including a channel that allows cooling water to pass through. As the cooling water circulates the heat sink 3 is cooled. The heat sink 3 is not limited to the one that is cooled by the circulating cooling water. In order to be cooled, the heat sink 3 may be set on a cooling block that allows cooling water to pass through. The heat sink 3 may be set on a cooling source such as a Peltier device.

In a description below, a forward direction is from the second end face toward the first end face, and a rearward direction is from the first end face toward the second end face. In the first embodiment, the substrate 11 is a rectangular parallelepiped extended rearward compared with the semiconductor laser element 1. The substrate 11 has a rear end face rearwardly of the second end face. The substrate 11 has a front end face rearwardly of the first end face. The substrate 11 is longer than the semiconductor laser element 1 in the optical axis direction.

In the first embodiment, the solder layer 12 and the junction layer 14 have their respective portions removed behind the second end face. The solder layer 12 and the junction layer 14 have their respective rear edges positioned forwardly of the second end face. The solder layer 12 has, in the optical axis direction, a front edge that is aligned with the front end face of the substrate 11. The junction layer 14 has, in the optical axis direction, a front edge that is aligned with the front end face of the substrate 11. The solder layer 12 and the junction layer 14 are both shorter than the semiconductor laser element 1 in the optical axis direction. The solder layer 12 and the junction layer 14 may both have the same length as the semiconductor laser element 1 in the optical axis direction.

The solder layer 13 has, in the optical axis direction, a rear edge that is aligned with the rear end face of the substrate 11. The junction layer 15 has, in the optical axis direction, a rear edge that is aligned with the rear end face of the substrate 11. A front edge of the solder layer 13 is aligned with the front end face of the substrate 11. A front edge of the junction layer 15 is aligned with the front end face of the substrate 11. The solder layer 13 and the junction layer 15 are both longer than the semiconductor laser element 1 in the optical axis direction. Thus the substrate 11, the solder layer 13, and the junction layer 15 are extended rearward compared with the semiconductor laser element 1.

In the manufacturing process of the semiconductor laser machine 20 according to the first embodiment, the solder material that is used for joining the semiconductor laser element 1 to the sub-mount 2 is not disposed behind the second end face. This prevents the molten solder material from climbing the second end face by being pressed against the semiconductor laser element 1 during soldering of the semiconductor laser element 1. Since the solder material is prevented from climbing the second end face, a short circuit between the active layer 10 and the solder layer 12 is preventable.

In the first embodiment, the solder layer 12 is not provided forward beyond the first end face. As the solder material is not provided in front of the first end face, the solder material is also prevented from climbing the first end face.

Dashed arrows illustrated in FIGS. 2 and 3 indicate how heat propagates from the semiconductor laser element 1 to the heat sink 3. In the first embodiment, the substrate 11 is extended rearward compared with the semiconductor laser element 1. Therefore, after the heat has propagated from the semiconductor laser element 1 through the solder layer 12 and the junction layer 14 to the substrate 11, rearward heat diffusion in the substrate 11 occurs beyond the second end face.

As the substrate 11, the solder layer 13, and the junction layer 15 are extended rearward compared with the semiconductor laser element 1, the diffused heat propagates from the substrate 11 to the heat sink 3 through the junction layer 15 and the solder layer 13. Because the heat from the semiconductor laser element 1 is diffused in the sub-mount 2, the semiconductor laser machine 20 can promote heat propagation from the semiconductor laser element 1 to the heat sink 3. Therefore, the semiconductor laser machine 20 can prevent short circuit failure and can achieve efficient heat dissipation.

Since the semiconductor laser machine 20 can efficiently dissipate the heat of the semiconductor laser element 1, strain of the semiconductor laser element 1 that is caused by its temperature distribution can be reduced. Consequently, the semiconductor laser machine 20 can reduce beam quality deterioration that results from the strain of the semiconductor laser element 1. Since the semiconductor laser machine 20 enables the efficient dissipation of the heat from the semiconductor laser element 1, deterioration of the semiconductor laser element 1 is also suppressed, leading to an extended lifetime of the semiconductor laser element 1.

Among a plurality of the side faces of the semiconductor laser element 1, the side faces excluding the first and second end faces, are referred to as a right side face and a left side face. The right and left side faces face each other in a leftward and a rightward direction. The substrate 11 is also extended in the leftward and rightward directions compared with the semiconductor laser element 1. In the first embodiment, the solder layer 12 and the junction layer 14 may have their portions removed from portions of the substrate 11 that extend from the semiconductor laser element 1 in the leftward and rightward directions just as these layers 12 and 14 have their respective portions removed from a portion of the substrate 11 that extends rearwardly from the second end face. This also prevents the solder material from climbing the right side face and the left side face. Therefore, the semiconductor laser machine 20 can prevent short circuit failures.

According to the first embodiment, the substrate 11 of the semiconductor laser machine 20 is extended rearward compared with the semiconductor laser element 1, and the solder layer 12 and the junction layer 14 have their respective portions removed behind the second end face. Therefore, the semiconductor laser machine 20 can prevent the short circuit failure and can efficiently dissipate the heat.

Figure 4:
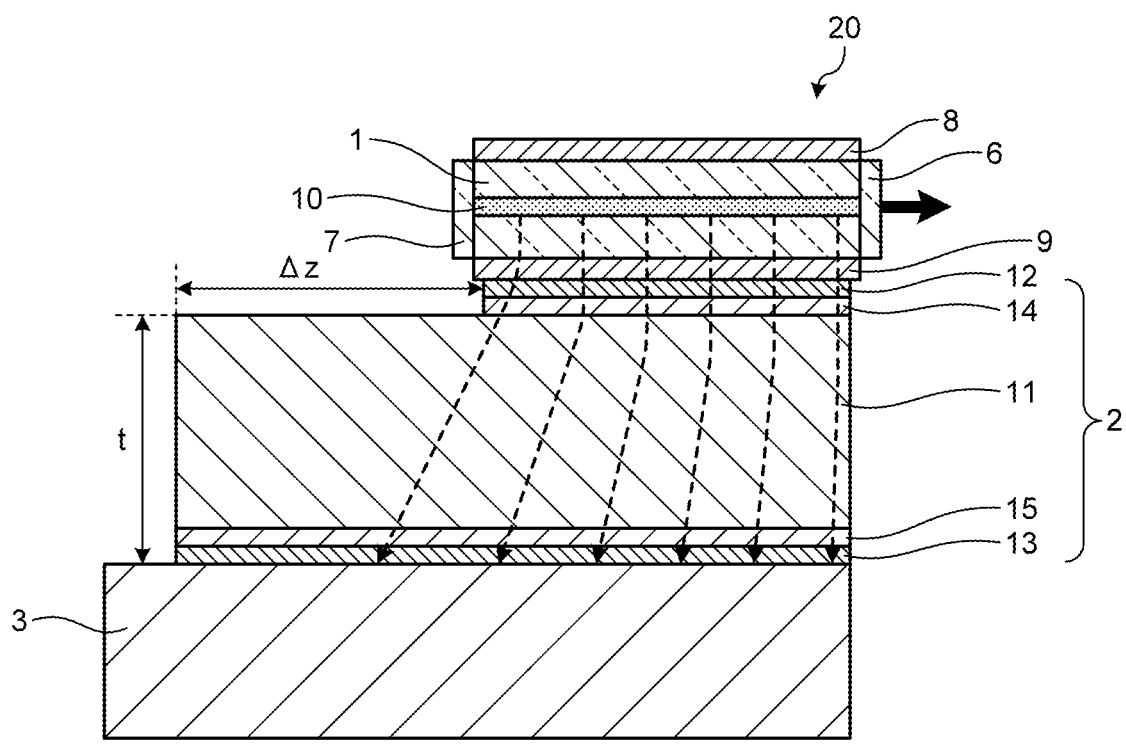
FIG. 4 illustrates a sectional view of a semiconductor laser machine variation according to the first embodiment.

FIG. 4 illustrates a sectional view of a semiconductor laser machine variation according to the first embodiment. Similarly with the sectional view illustrated in FIG. 3, the sectional view illustrated in FIG. 4 includes the optical axis of the resonator and is perpendicular to the sectional view illustrated in FIG. 2. In the variation according to the first embodiment, a distance $\Delta z$ between the rear edge of the solder layer 12 and a rear end face of the sub-mount 2 is greater than a thickness t of a portion of the sub-mount 2 that includes the rear end face.

For promoted heat propagation from the semiconductor laser element 1 to the heat sink 3, the substrate 11 desirably secures, in the optical axis direction, a dimension that enables a heat transfer route in the substrate 11 to extend at about 45 degrees to the stacked direction. The satisfaction of $\Delta z > t$ ensures the heat transfer route that extends at about 45 degrees in a portion of the substrate 11 that extends rearwardly from the second end face. Therefore, this semiconductor laser machine 20 that satisfies $\Delta z > t$ enables heat to be diffused in the substrate 11 for efficient heat dissipation. The semiconductor laser machine 20 given as the variation according to the first embodiment can prevent short circuit failure and can efficiently dissipate heat.

Second Embodiment

Figure 5:
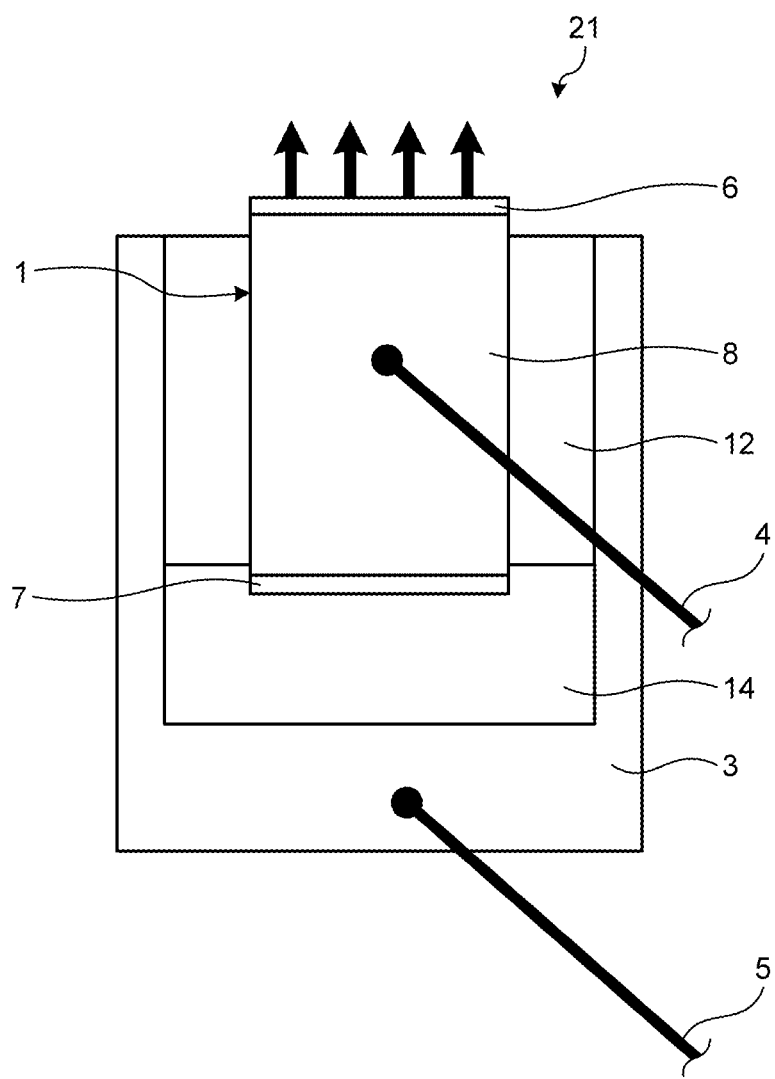
FIG. 5 is a top view of a semiconductor laser machine according to a second embodiment.
Figure 6:
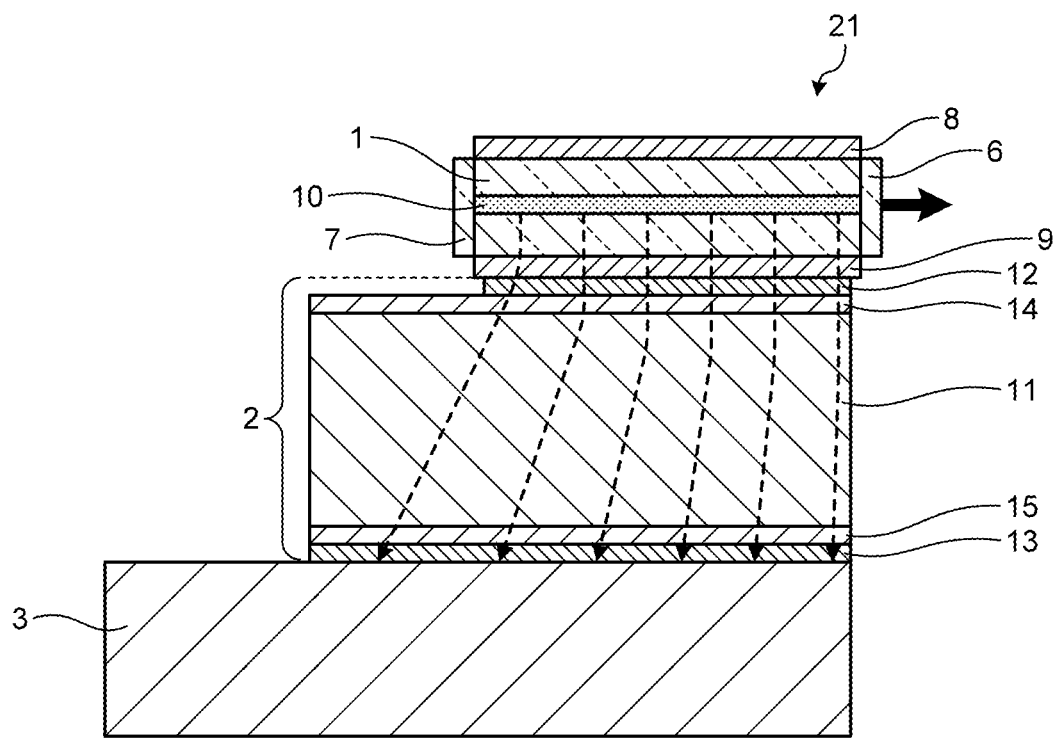
FIG. 6 illustrates a sectional view of the semiconductor laser machine according to the second embodiment.

FIG. 5 is a top view of a semiconductor laser machine according to a second embodiment. FIG. 6 illustrates a sectional view of the semiconductor laser machine according to the second embodiment. In the semiconductor laser machine 21 according to the second embodiment, not both the solder layer 12 and the junction layer 14, but only the solder layer 12 has its portion removed behind the second end face of the semiconductor laser element 1. In the second embodiment, constituent elements identical with those in the above-described first embodiment have the same reference numerals, and a description is provided mainly of difference from the first embodiment. The sectional view illustrated in FIG. 6 includes the optical axis and is taken along the stacked direction.

The junction layer 14 has, in the optical axis direction, the rear edge that is aligned with the rear end face of the substrate 11. The junction layer 14 has the same length as the substrate 11 in the optical axis direction. Thus, in the second embodiment, only the junction layer 14, not both the solder layer 12 and the junction layer 14, is extended rearward compared with the semiconductor laser element 1. The portion of the solder layer 12 is removed behind the second end surface.

In the second embodiment, the sub-mount 2 may be either electrically conductive or insulating. FIG. 5 illustrates a configuration example in which an electrically conductive sub-mount 2 is used. When the electrically conductive sub-mount 2 is used, the lead wire 5 is connected to the heat sink 3.

Figure 7:
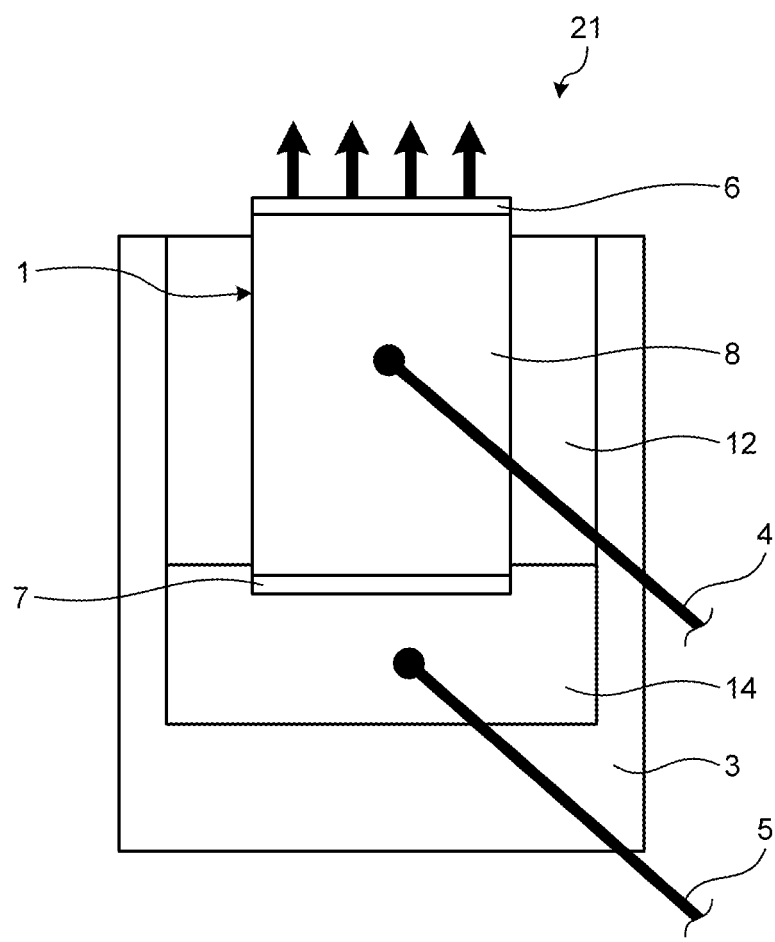
FIG. 7 illustrates a configuration example of a semiconductor laser machine according to the second embodiment that uses an insulating sub-mount.

FIG. 7 illustrates a configuration example of a semiconductor laser machine according to the second embodiment that uses the insulating sub-mount. An insulating material is used for the substrate 11 of the insulating sub-mount 2. The lead wire 4 is connected to the electrode 8 similarly as the case of the electrically conductive sub-mount 2. Unlike in the case of the electrically conductive sub-mount 2, the lead wire 5 is connected to the junction layer 14. For the substrate 11 of the insulating sub-mount 2, a ceramic material such as aluminum nitride or silicon carbide is used.

In the second embodiment, the junction layer 14 is exposed behind the second end face, thus it is possible to power the semiconductor laser element 1 via the junction layer 14. Therefore, the junction layer 14 is used as a feeder unit in the second embodiment, making it possible to use the insulating sub-mount 2. When the heat sink 3 is a water-cooled heat sink, the use of the insulating sub-mount 2 prevents electrolytic corrosion, which is a problem associated with the water-cooled heat sink.

In manufacturing process of the semiconductor laser machine 21 according to the second embodiment, a solder material that is used for joining the semiconductor laser element 1 to the sub-mount 2 is not disposed behind the second end face. This prevents the molten solder material from climbing the second end face by being pressed against the semiconductor laser element 1 during soldering of the semiconductor laser element 1. Since the solder material is prevented from climbing the second end face, a short circuit between the active layer 10 and the solder layer 12 is preventable. As in the first embodiment, the substrate 11 in the second embodiment is extended rearward compared with the semiconductor laser element 1. Therefore, the semiconductor laser machine 21 can prevent short circuit failure and can efficiently dissipate heat.

In the second embodiment, the solder layer 12 may have its portions removed from the portions of the substrate 11 that extend from the semiconductor laser element 1 in the leftward and rightward directions, just as the solder layer 12 has its portion removed from the portion of the substrate 11 that extends rearwardly from the second end face. This also prevents the solder material from climbing the right side face and the left side face. Therefore, the semiconductor laser machine 21 can prevent short circuit failures.

As in the variation according to the first embodiment, the distance Δz between the rear edge of the solder layer 12 and the rear end face of the sub-mount 2 and the thickness t of the portion of the sub-mount 2 that includes the rear end face may satisfy Δz>t in the second embodiment. Thus the semiconductor laser machine 21 can prevent short circuit failure and can efficiently dissipate heat.

According to the second embodiment, the solder layer 12 of the semiconductor laser machine 21 has its portion removed behind the second end face. Therefore, the semiconductor laser machine 21 can prevent the short circuit failure and can efficiently dissipate heat.

According to the first and second embodiments, the substrate 11 of each of the semiconductor laser machines 20 and 21 is extended rearward compared with the semiconductor laser element 1, and as for the solder layer 12 and the junction layer 14, the portion of at least the solder layer 12 is removed behind the second end face. Therefore, each of the semiconductor laser machines 20 and 21 can prevent the short circuit failure and can efficiently dissipate heat.

Third Embodiment

Figure 8:
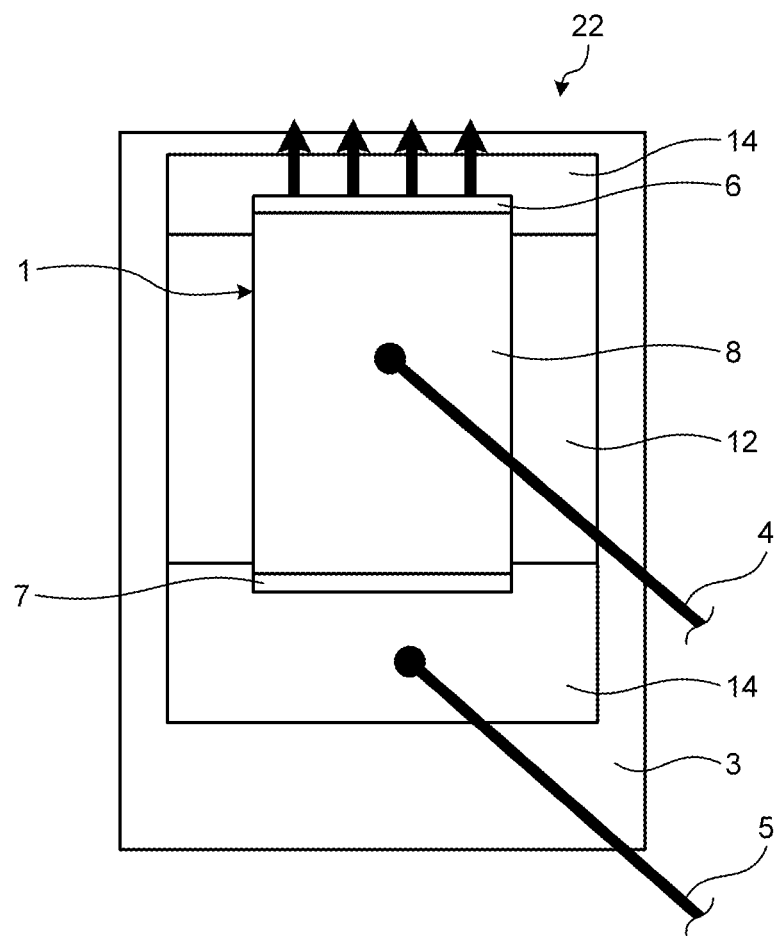
FIG. 8 is a top view of a semiconductor laser machine according to a third embodiment.
Figure 9:
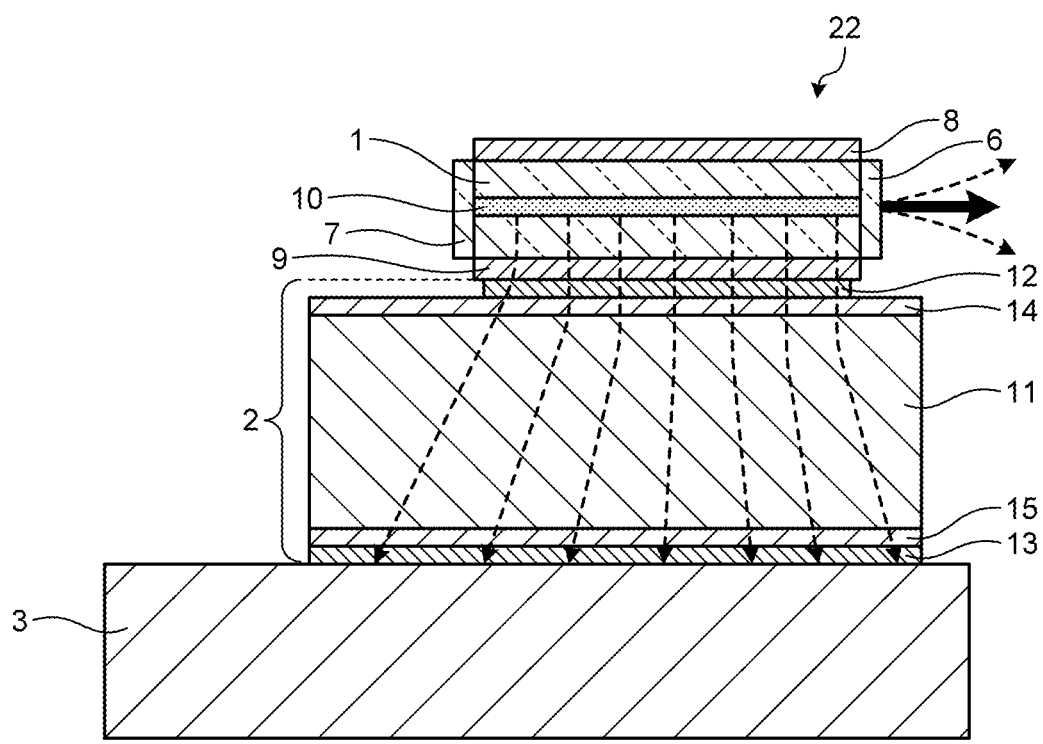
FIG. 9 illustrates a sectional view of the semiconductor laser machine according to the third embodiment.

FIG. 8 is a top view of a semiconductor laser machine according to a third embodiment. FIG. 9 illustrates a sectional view of the semiconductor laser machine according to the third embodiment. In the semiconductor laser machine 22 according to the third embodiment, the substrate 11 is extended forwardly beyond the first end face of the semiconductor laser element 1, thus being extended compared with the semiconductor laser element 1. In the third embodiment, constituent elements identical with those in the above-described first or second embodiment have the same reference numerals, and a description is provided mainly of difference from the first or second embodiment. The sectional view illustrated in FIG. 9 includes the optical axis and is taken along the stacked direction.

The substrate 11 is extended rearward and forward compared with the semiconductor laser element 1. The substrate 11 has the front end face forwardly positioned of the first end face. The substrate 11 is longer than the semiconductor laser element 1 in the optical axis direction.

As in the second embodiment, not both the solder layer 12 and the junction layer 14, but only the solder layer 12 has its portion removed behind the second end face of the semiconductor laser element 1 in the third embodiment. In front of the first end face of the semiconductor laser element 1, only the solder layer 12, not the solder layer 12 and the junction layer 14, has its portion removed. The junction layer 14, has in the optical axis direction, the front edge aligned with the front end face of the substrate 11. Respective portions of the substrate 11 and the junction layer 14 that extend forwardly from the first end face have, in the optical axis direction, lengths that do not cause a diffusing laser beam from the first end face of the semiconductor laser element 1 to interfere with the junction layer 14.

The substrate 11 in the third embodiment is extended rearward and forward compared with the semiconductor laser element 1. Heat that has propagated to the substrate 11 from the semiconductor laser element 1 via the solder layer 12 and the junction layer 14, is diffused rearward in the substrate 11 beyond the second end face, and is diffused forward in the substrate 11 beyond the first end face. Since the rearward heat diffusion and the forward heat diffusion occur in the substrate 11, the semiconductor laser machine 22 can promote heat propagation from the semiconductor laser element 1 to the heat sink 3. Therefore, the semiconductor laser machine 22 can prevent short circuit failure and can efficiently dissipate heat.

In the third embodiment of the semiconductor laser machine 22, it is possible to improve cooling efficiency in the vicinity of the first end face where the temperature tends to rise easily in the semiconductor laser element 1, because the heat diffuses beyond the first end face in the substrate 11. In the semiconductor laser machine 22, since it is possible to improve cooling efficiency in the vicinity of the first end face, deterioration of the semiconductor laser element 1 is suppressed, and lifetime of the semiconductor laser element 1 is extended.

In manufacturing process of the semiconductor laser machine 22 according to the third embodiment, a solder material that is used for joining the semiconductor laser element 1 to the sub-mount 2 is not disposed in front of the first end face. This prevents the molten solder material from climbing the first end face by being pressed against the semiconductor laser element 1 during soldering of the semiconductor laser element 1. Since the solder material is prevented from climbing the first end face, a short circuit between the active layer 10 and the solder layer 12 is preventable.

In the third embodiment, the solder layer 12 and the junction layer 14 may have their portions removed both behind the second end face and in front of the first end face. This semiconductor laser machine 22, too, prevents short circuits between the active layer 10 and the solder layer 12.

In the third embodiment, the solder layer 12 may have its portions removed from the portions of the substrate 11 that extend from the semiconductor laser element 1 in the leftward and rightward directions. This also prevents the solder material from climbing the right side face and the left side face. Therefore, the semiconductor laser machine 22 can prevent short circuit failures.

As in the variation according to the first embodiment, the distance $\Delta z$ between the rear edge of the solder layer 12 and the rear end face of the sub-mount 2 and the thickness t of the portion of the sub-mount 2 that includes the rear end face may satisfy $\Delta z > t$ in the third embodiment. Thus the semiconductor laser machine 22 can prevent short circuit failure and can efficiently dissipate heat.

According to the third embodiment, the substrate 11 of the semiconductor laser machine 22 is extended forward compared with the semiconductor laser element 1, and the solder layer 12 has its portion removed in front of the first end face. Therefore, the semiconductor laser machine 22 can prevent the short circuit failure and can efficiently dissipate heat.

The above configurations illustrated in the embodiments are illustrative of contents of the present disclosure. The configurations of the embodiments can be combined with other techniques that are publicly known. The configurations of the embodiments may be combined together as appropriate. The configurations of the embodiments can be partly omitted or changed without departing from the gist of the present disclosure.

REFERENCE SIGNS LIST 1 semiconductor laser element; 2 sub-mount; 3 heat sink; 4, 5 lead wire; 6, 7 coating film; 8, 9 electrode; 10 active layer; 11 substrate; 12, 13 solder layer; 14, 15 junction layer; 20, 21, 22 semiconductor laser machine.

The invention claimed is:

1. A semiconductor laser machine comprising:
a semiconductor laser element including a first end face adapted to emit a laser beam and a second end face that is opposite the first end face;
a heat sink; and
a sub-mount adapted to fix the semiconductor laser element to the heat sink, wherein
the sub-mount includes:
a substrate adapted to relieve thermal stress;
a solder layer joined to the semiconductor laser element; and
a junction layer formed between the substrate and the solder layer,
compared with the semiconductor laser element, the substrate is extended in a rearward direction that is from the first end face toward the second end face, and
the solder layer and the junction layer are removed behind the second end face, wherein
the solder layer and the junction layer have respective rear edges positioned forwardly of the second end face, and
a front edge of the solder layer and a front edge of the junction layer are aligned with a front end face of the substrate.

2. The semiconductor laser machine according to claim 1, wherein
a distance between a rear edge of the solder layer and a rear end face of the sub-mount is greater than a thickness of a portion of the sub-mount that includes a rear end face.

3. The semiconductor laser machine according to claim 1, wherein
the sub-mount includes:
a first solder layer, as the solder layer, joined to the semiconductor laser element;
a first junction layer, as the junction layer, formed between the substrate and the first solder layer;
a second solder layer joined to the heat sink; and
a second junction layer formed between the substrate and the second solder layer; wherein
the second solder layer, and the second junction layer are extended rearward compared with the semiconductor laser element.

4. The semiconductor laser machine according to claim 2, wherein
the sub-mount includes:
a first solder layer, as the solder layer, joined to the semiconductor laser element;
a first junction layer, as the junction layer, formed between the substrate and the first solder layer;
a second solder layer joined to the heat sink; and
a second junction layer formed between the substrate and the second solder layer; wherein
the second solder layer, and the second junction layer are extended rearward compared with the semiconductor laser element.

* * * * *